United States Patent [19]

Valentin

[11] Patent Number: 4,575,689
[45] Date of Patent: Mar. 11, 1986

[54] HIGH FREQUENCY OSCILLATOR WITH A COMPENSATED ISOCHRONISM DEFICIENCY

[75] Inventor: Jean P. Valentin, Pouilley les Vignes, France

[73] Assignee: L'Etat Francais represente par le Delegue General pour l'Armement, Paris, France

[21] Appl. No.: 560,225

[22] Filed: Dec. 12, 1983

[30] Foreign Application Priority Data

Dec. 27, 1982 [FR] France .................. 82 21797

[51] Int. Cl.⁴ .............................................. H03B 5/30
[52] U.S. Cl. .................................. 331/116 R; 331/70; 331/160; 331/176
[58] Field of Search .............. 331/116 R, 116 FE, 69, 331/70, 158, 160, 176, 43

[56] References Cited

U.S. PATENT DOCUMENTS 3,617,923 11/1971 Paradysz ........................ 331/43
4,334,168 6/1982 Besson et al. .................. 310/343
4,468,634 8/1984 Takagi et al. .................. 331/158 X

FOREIGN PATENT DOCUMENTS 2462055 7/1983 France .

OTHER PUBLICATIONS

Valentin et al, "Indirect Amplitude-Frequently Effect in Resonators Working on Two Frequencies," printed in Proceedings 35th Annual Frequency Control Symposium, May 1981.
Valentin, "Internal Heating and Thermal Regulation of Bulk Quartz Resonators," Printed in Proc. 34th Ann. Freq. Control Symposium, May 1980.

Primary Examiner—Eugene R. LaRoche
Assistant Examiner—Robert J. Pascal
Attorney, Agent, or Firm—Parkhurst & Oliff

[57] ABSTRACT

The high frequency oscillator includes a piezo-electric crystal (1) which is connected to at least two exciter electrodes (3, 4) and means which make it possible to apply on the one hand to the electrodes (3, 4) electric excitation power for the crystal according to a useful vibratory mode which is selected to determine a frequency reference, and on the other hand additional electric power for exciting the crystal according to an overtone vibratory mode which is distinct from the useful vibrational mode. Means (46, 47) are also provided to regulate the electric excitation power of the crystal according to the useful vibratory mode in a predetermined and constant proportion in relation to the additional electric power. The invention makes it possible to compensate, using the isochronism deficiency stemming from the additional vibration on the useful mode, the indirect amplitude-frequency effect stemming from the additional vibration, and vice versa.

12 Claims, 3 Drawing Figures

HIGH FREQUENCY OSCILLATOR WITH A COMPENSATED ISOCHRONISM DEFICIENCY

TECHNICAL FIELD

This invention pertains to high frequency piezoelectric oscillators.

BACKGROUND

The invention is applicable to high frequency oscillators which include, assembled on a sealed structure, a piezoelectric crystal that is connected to at least two exciter electrodes which produce an electric field in the active part of the piezo-electric crystal. Means are provided for applying to the electrodes on the one hand electric excitation power to vibrate the crystal according to a useful vibratory mode selected to determine a frequency reference, and on the other hand electric internal heating power to excite the crystal according to a second vibratory mode consisting of a non-harmonic overtone vibration which is distinct from the useful vibratory mode. The electric internal heating power is typically regulated with a temperature pick-up, which is located on the resonator or in its vicinity, in order to maintain the temperature of the resonator constant at the crystal reversal point.

Such an oscillator structure is described for instance in the French patent application No. 79 18553, now French Pat. No. 2462055, entitled "Self-Thermostated High Frequency Oscillator". Because the electric heating power is directly applied on the resonator, it is possible to limit the necessary energy expenditure for operating the oscillator. Then, the oscillator no longer has to be equipped with a conventional thermostat which is set at a temperature that is lower than the reversal temperature of the resonator crystal, for example, set at 50° C. if the reversal point (PI) of the crystal is 85° C., or at 35° C. if the PI of the crystal is 70° C.

However, in order for the vibration which is used as a frequency reference to be sufficiently accurate, it is necessary for the isochronism deficiency, also called amplitude-frequency effect or A.F. effect, to be as weak as possible and for the decoupling between both vibrations selected for the frequency reference and for internal heating to be as strong as possible.

Those conditions cannot always be achieved in practice. For instance, it is often necessary to build an oscillator around a resonator having a crystal which is of a single rotation section, such as an AT section. Indeed, this type of section displays advantages which are significant, such as manufacturing ease, low cost, low hysteresis deficiency and the fact that the reversal point of their temperature-frequency characteristic is high (greater than 80° C.). And yet, an AT section crystal is not easily corrected for isochronism deficiency, and decoupling between the different vibration frequencies is easily not achieved.

SUMMARY OF THE INVENTION

Thus, the invention is designed to provide an oscillator which displays the advantages of an internal heater of the self-thermostating type (fast start-up, reduced energy expenditure, use of a conventional thermostat), and which also displays a frequency variation, dependent on A.F. effects, that is reduced to a minimum.

This invention is also designed to enable the improvement of performances both for oscillators that use single rotation crystals (for instance AT or BT sections) and oscillators that use dual rotation crystals (for instance SC sections).

Those goals are reached with a HF oscillator of the type according to this invention which includes means to adjust the excitation electric power of the crystal used to induce the useful vibratory mode in a predetermined and constant proportion in relation to the main heating electric power so as to achieve, considering the deleterious isochronism deficiency effects produced by the crystal vibration on the selected useful vibratory mode, a compensation of the indirect amplitude-frequency effect which is produced on the frequency of the useful vibratory mode by the vibration designed to generate the main internal heating. In other words, the electric power, applied to produce vibrations on the useful vibratory mode, is adjusted to compensate for variations in frequency of the useful mode caused by the second vibratory mode used for crystal heating.

Because the internal electric heating power which is applied to the crystal on the vibrating heating mode is adjusted by a temperature pick-up, the variations in that electric heating power cause, through an indirect amplitude-frequency effect, a variation in the frequency of the useful frequency reference mode. In order to compensate for those induced frequency variations, and to maintain stability in the frequency of the useful frequency reference mode, it is suggested according to this invention that variations should be produced in the electric excitation power applied to the crystal to produce the useful vibratory mode. These variations can be opposed to frequency variations induced by the indirect amplitude-frequency effect as a result of the presence of an internal heating vibration. For this purpose, means are provided for executing concomitant adjustment of excitation electric power on the useful and main internal heating mode.

In this regard, it must be determined, for a given crystal, the variation law relating the vibration frequency on a useful mode to the electric power that is applied to incite a heating vibration, as well as the variation law relating the vibration frequency of the useful mode to the electric power applied to incite this useful vibration.

Those laws were experimentally determined and they are presented in the paper by J. P. Valentin, C. P. Guerin and R. J. Besson entitled "Indirect Amplitude-Frequency Effect in Resonators Working on Two Frequencies" which was printed in "Proceedings 35th Annual Frequency Control Symposium" 1981.

According to a preferred embodiment of the invention, a piezo-electric crystal of an AT section is provided which is proportioned and excited to display a useful vibration frequency on the fifth overtone as well as a main internal heating vibration frequency at a frequency which is distinct from the useful frequency, on the third overtone. The total internal electric power applied to the electrodes of the resonator, that is adjusted according to the signals supplied by said temperature pick-up, being distributed in ratios of about 70% on the third overtone and about 30% on the fifth overtone, the power distribution being produced by a prior adjustment of oscillator adjustment means.

According to another preferred embodiment of the invention, the piezo-electric crystal is of a SC section and is proportioned and excited to display a useful vibration frequency on the third overtone of a vibratory mode, mode C, as well as an internal heating vibration frequency on the third overtone of a vibratory mode, mode B. For a given variation $\Delta P_B$ of the internal electric power applied to the electrodes of the resonator on mode B, means are provided to inversely vary the electric power which is applied to the mode C at about 28.5% of the variation $\Delta P_B$ of the internal electric power applied to the mode B. As used herein, vibratory modes B and C can be, for example, a flexural mode, a tortional mode, a thickness shear mode, or any other known vibratory modes of a piezoelectric crystal.

In that instance, the temperature pick-up advantageously includes two electrodes that cooperate with the piezo-electric crystal in order to produce a vibration of the crystal on mode B, which is distinct from the vibration that is used for the main internal heating, the different vibration on mode B representing a thermometric mode.

Particularly, the excitation electric power on the useful and main internal heating mode is applied with two distinct oscillation loops and the excitation electric power on the thermometric mode is applied to the resonator with a third oscillation loop which is connected to a pair of electrodes that are distinct from the pair of electrodes connected to the two initial oscillation loops, the excitation electric power on the thermometric mode remaining insignificant in relation to the main internal heating power.

The invention also relates to a HF oscillator which includes, mounted in a sealed structure, a piezo-electric resonator that is comprised of at least one piezo-electric crystal which is connected to at least two exciter electrodes which generate an electric field in the active part of the crystal from an adjustable voltage supply source which can vary in time, the supply source providing an excitation electric power for the crystal according to a useful vibratory mode which is selected to determine a frequency reference.

Such a HF oscillator is designed to provide a stable frequency reference but it is still susceptible, as a result of unavoidable voltage variations in the supply source, to frequency fluctuations or shifts incited by the isochronism deficiency which is inherent to all crystals.

The invention is directed to improving the stability in an oscillator of that type and to free it from voltage variations in the adjustable supply source.

This is possible because the present invention applied to a HF oscillator of the previously mentioned type also includes means to apply a predetermined fraction of power to the resonator of the excitation electric power which is applied to the electrodes in conjunction with a vibration on the useful vibratory mode, in order to generate a vibration on another predetermined vibration mode of the resonator so as to provide an indirect amplitude-frequency effect on the useful vibratory mode which compensates for the isochromism deficiency stemming from variations in the excitation electric power applied to the electrodes.

According to a characteristic of this invention, the excitation electric power for the useful mode, and that applied for compensation by indirect amplitude-frequency effect, are applied with two distinct oscillation loops which are supplied from the same voltage regulator.

More particularly, the distribution of electric power applied to the two oscillation loops is achieved with a bridge of resistors that, if need be, is connected to a linear potentiometer and inserted between the voltage regulator and the oscillation loops.

The voltage regulator includes two supply sources and one comparator.

In the event that the piezo-electric crystal is of an AT section and is proportioned and excited to display a useful vibration frequency of a fifth overtone as well as a compensation vibration frequency of a third overtone, the internal electric power which is applied to the electrodes of the resonator is distributed with fractioning means at ratios of about 30% on the fifth overtone, and of about 70% on the third overtone.

In the event that the piezo-electric crystal is a SC section and it is proportioned and excited to display a useful vibration frequency on the third overtone of vibratory mode C as well as a compensation vibration frequency on the third overtone of vibratory mode B, means are provided to have the electric power applied to mode C vary inversely with the power applied to mode B in a ratio of about 3.5 times the variation $\Delta P_C$ of the internal electric power that is applied to mode C.

Other characteristics and advantages of the invention will become evident from the description that follows of particular implementation modes of the invention, which is provided with reference to attached drawings.

DETAILED DESCRIPTION

Figure 1:
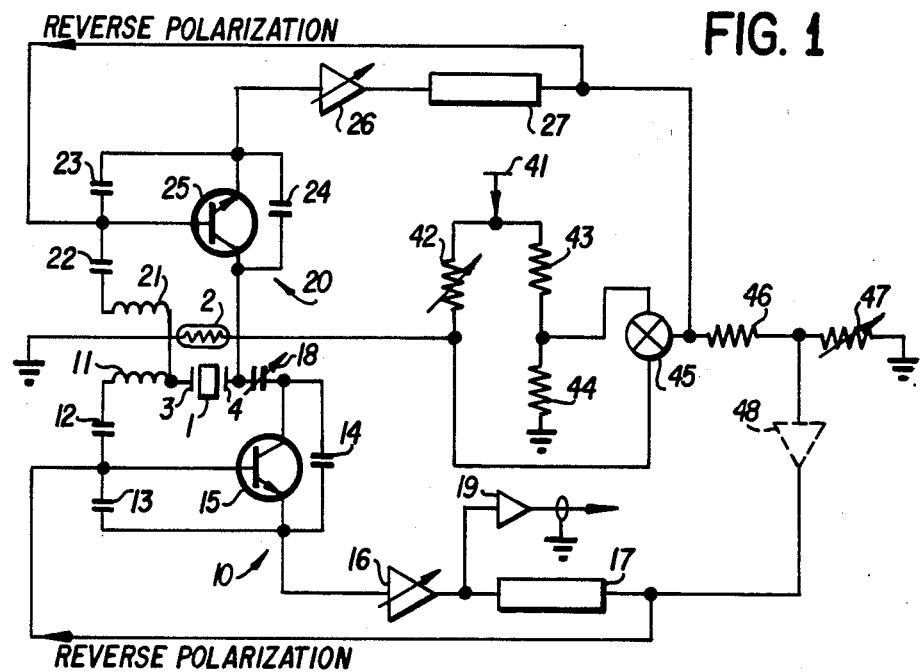
FIG. 1 depicts the electric diagram of a HF oscillator according to the invention with a regulation loop for the electric heating power of the crystal, and a regulation loop for the electric excitation power that is applied to the crystal in order to make it vibrate on a useful frequency reference mode.

Referring to FIG. 1, a HF oscillator is shown built around a resonator comprised of a piezo-electric crystal 1 that is connected to two electrodes 3, 4. An initial oscillation loop 10, which is used to control a frequency reference, includes, mounted in series between the collector and the base of a transistor 15, an adjustable condenser 18, the resonator 1, 3, 4, an inductance 11 and a decoupling condenser 12. A condenser 13 is also mounted between the base and the emitter of the transistor 15 while a condenser 14 is mounted between the emitter and the collector of the transistor 15. The totality of elements 11 through 15, of resonator 1, 3, 4 and of the adjustable condenser 18 represents a selective circuit that, with the latter adjustable element, can be centered very accurately on a pre-set frequency, for instance 5 MHz. The emitter of the transistor 15 is connected to a variable gain amplifier 16, followed by a power amplifier 19, and then to an output terminal for a frequency reference signal. A sensing circuit 17 is also connected between the output of the amplifier 16 and a poling line that is connected to the base of the transistor 15 in order to constitute, with the amplifier 16, an automatic gain control circuit. The initial power in the oscillation loop 10 is regulated by the gain that is selected for the amplifier 16.

A second oscillation loop 20, which is used to control internal crystal heating, includes, in series with the resonator 1, 3, 4, an inductance 21 and a decoupling condenser 22; 21 and 22 being connected between the base and the collector of a transistor 25. A condenser 23 is mounted between the base and the emitter of the transistor 25 while a condenser 24 is mounted between the collector and the emitter of the transistor 25. The totality of elements 1, 3, 4; 21 through 25 represents a selective circuit that is centered on a frequency that is different from the frequency of the selective circuit of the loop 10. An automatic gain control circuit which includes a variable gain amplifier 26 and a sensing circuit 27 is connected between the emitter and the base of the transistor 25.

The base of the transistor 25 is also connected to a regulation circuit which includes a reference supply voltage source 41 that is connected to a bridge of resistors 2, 42, 43, 44 which is associated to a comparator 45. The bridge of resistors includes two resistors 43, 44 which are mounted in series between the source 41 and ground, as well as an adjustable resistor 42 and a thermistor 2 that are also mounted in series between the source 41 and ground. The thermistor 2 is placed in the vicinity of the crystal 1 and it represents a temperature pick-up. The inputs of the comparator 45 are connected to the common connecting points between the resistors 43 and 44 on the one hand, and between the adjustable resistor 42 and the thermistor 2 on the other hand, while the output of the comparator 45 is connected to the output of the sensing circuit 27 and to the base of the transistor 25. The adjustable resistor 42 makes it possible to balance the measuring bridge 42, 2, 43, 44 for a preset temperature, for instance the temperature of the reversal point of the quartz crystal 1. A temperature variation which is sensed by the thermistor 2 is translated into a voltage at the output of the comparator 45. This voltage is divided with a bridge of resistors 46, 47 on the bases of the transistors 15, 25. The resistor 46 and the adjustable resistor 47 are mounted between the output of the comparator 45 and ground, the common connection point of the resistors 46, 47 being connected to the base of the transistor 15. As we can see, the variations in the electric power applied to the oscillation loop 10 from the common connection point of the resistors 46, 47, represent a fraction of the variations in the electric power which is applied to the oscillation loop 20 which represents a regulation loop in relation to temperature. The initial power of each oscillation loop 10, 20 is regulated by the gain which is selected for the amplifiers 16, 26. For each of oscillation loops 10, 20, the automatic gain control circuit 16, 17, or 26, 27 respectively, amplifies the signal that is available on the emitter of the corresponding transistor 15, 25, and the resulting voltage makes it possible to control the conduction of the corresponding transistor 15, 25.

The adjustable resistor 47 makes it possible to regulate the power variation ratio which is required from each oscillator loop 10, 20 in the event of a change in temperature at which the quartz crystal 1 must be maintained.

It should be noted that the condensers 12, 22, which are connected to the base of the transistors 15, 25 of loops 10, 20 simply decouple the drive circuits for each of the transistors 15, 25.

The circuits from FIG. 1 which correspond to an operation of the resonator 1, 3, 4 on two different frequencies with power that is controlled for each of oscillation loops 10, 20 can be applied to single rotation crystals, for instance of AT or BT section or double rotation crystals, for instance of SC section. In the latter instance, we should insert an additional reversing circuit 48 between the common point of the resistors 46, 47 and the base of the transistor 15 of the oscillation loop 10. Indeed, as it will be explained in more detail below, the changes in metrological frequency in relation to the excitation power of that metrological mode, which are related to the direct A.F. effect, and the changes in that frequency that are related to the indirect A.F. effect induced by the changes in the compensation mode power, are linear and directly proportional for a SC section.

In the case of the diagram in FIG. 1, the two oscillation loops 10, 20, can use the same resonator 1, 3, 4 which includes common electrodes 3, 4. However, it is also possible to use two pairs of different electrodes for the two oscillation loops 10, 20, each pair of electrodes cooperating with the same crystal 1.

Figure 2:
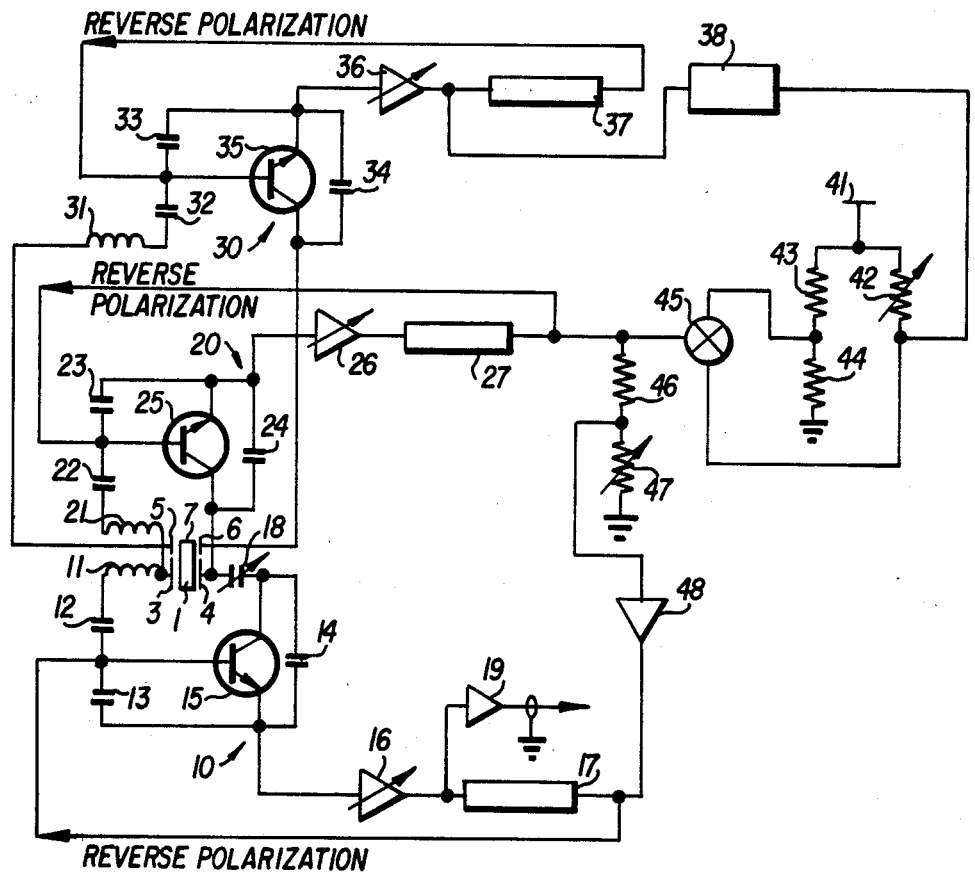
FIG. 2 depicts the electric diagram of a HF oscillator which is analogous to that of FIG. 1 in which the temperature pick-up is comprised of the crystal proper, that is connected to an additional oscillation loop.

The diagram in FIG. 2 is similar to that of FIG. 1 but it is more specifically suited to the crystals with a SC section. The elements that are similar to the circuit in FIG. 1 carry the same references in FIGS. 1 and 2. Thus, the two oscillation loops 10, 20 are completely alike in both figures. However, in FIG. 2, the temperature pick-up is not comprised of a thermistor, but of a pair of electrodes 5, 6 that cooperate with a section 7 of the crystal 1 in order to form a resonator 5, 6, 7. This resonator 5, 6, 7 is incorporated into an oscillation loop 30 of which elements 31 through 37, respectively, correspond to elements 11 through 17 of oscillation loop 10, or to elements 21 through 27 of oscillation loop 20. However, the resonator 5, 6, 7 is adapted to create vibrations on a thermomeric overtone of mode B which is particularly sensitive to temperature, and which is distinct from the overtone of mode B which is used for the internal heating of the crystal and for temperature regulation within oscillation loop 20. Furthermore, the excitation electric power on the thermometric mode B, which is applied by oscillation loop 30, is set so as to remain insignificant in relation to the main internal heating power which is applied by oscillation loop 20.

The output of the adjustable gain amplifier 36 is applied by way of a frequency-voltage conversion circuit 38 at the end of the adjustable resistor 42 which is connected to the source 41, so as to supply within the measuring bridge 42, 43, 44, 38 a signal which destabilizes when the temperature of the crystal differs from the selected predetermined temperature which corresponds for instance to the crystal reversal point. Regulation of internal heating with oscillation loop 20 and compensation of the indirect amplitude-frequency effect in oscillation loop 10 is produced by oscillation loop 20 on the reference vibration of the crystal take place in the same way as in the case of FIG. 1 through the divider 46, 47.

Now, we will describe examples of use for the circuits in FIGS. 1 and 2.

With a circuit like the one in FIG. 1, it is possible to use AT section quartz crystals which display a fairly significant isochronism deficiency.

For instance the metrological reference frequency can correspond to the shearing vibration which is 5 MHz at the fifth overtone known as 5 MHz P5. The electric power which is applied to that vibration can be fairly high for instance equal to about 4 mW.

We can select as a second vibration which achieves the greatest portion of internal heating the third overtone from the basic mode at 3 MHz, or the 3 MHz P3. The electric power which is applied for that heating vibration for instance equals about 10 mW. This electric power that is applied by oscillating loop 20 is regulated by the temperature pick-up 2 which is located near the oscillator hood or preferably near the resonator, for instance on the resonator slice or on the resonator ring in the event of a monolithic suspension of electrodes which do not adhere to the crystal and that displays a support ring. Temperature regulation makes it possible to constantly maintain at a predetermined value, the temperature of the resonator, for instance at a temperature that corresponds to the crystal reversal point which can equal about 85° C.

The power changes which are applied to oscillation loop 20 at 3 MHz P3 produce, through an indirect amplitude-frequency effect, a variation in the frequency of oscillator 10 at 5 MHz P5. For a AT section, the relative frequency variation for the vibration at 5 MHz P5 equals about some $10^{-6}$ per milliwatt in power change for oscillator 20 at 3 MHz P3.

With the assembly depicted in FIG. 1, the power of metrological mode 5 MHz P5 varies in a way which can compensate, by the direct amplitude-frequency effect (or isochronism deficiency), for the indirect amplitude-frequency effect stemming from variations in the power of the heating vibration at 3 MHz P3.

It was experimentally determined that the change in metrological frequency 5 MHz P5 in relation to the power of the heating vibration 3 MHz P3 (indirect A.F. effect) and the change in metrological frequency 5 MHz P5 according to its own power (direct A.F. effect) are linear and they display slopes with different signs. Thus, for the indirect AF effect, I measured a $\Delta f/f$ slope which is close to $-2.5 \, 10^{-6}/mW$ (in relative value), and this slope depends only slightly on the operating power of the oscillator at 5 MHz P5. Thus, the slope $= -2.7 \, 10^{-6}/mW$ for a power of 2 mW applied to the vibration 5 MHz P5 and the $\Delta f/f$ slope $= -2.3 \cdot 10^{-6}/mW$ for a power of 100 $\mu$W applied to the 5 MHz P5 vibration. With regard to the direct AF effect, I measured a slope of $+5 \cdot 10^{-6}/mW$, which corresponds to a slope that is about double that of the indirect AF effect, and in reverse direction, which makes it possible to achieve compensation faciliated by the single divider bridge 46, 47, without inverting circuit 48.

As an example, if the average operating point of oscillator 20 at 3 MHz P3 corresponds to 10 mW, and if the temperature pick-up 2 records a drop in temperature for crystal 1, the electronic compensation system which especially includes the comparator 45 controls the circuit that regulates the power of oscillator loop 20 for 3 MHz P3 in order to increase power by 0.1 mW for instance, leading through an indirect AF effect to a drop in the output frequency of the oscillation loop 10 such as $\Delta f/f$ (5 MHz) $= 2.3 \, 10^{-7}$.

This frequency variation must be compensated by an increase in the power of oscillator 10 at 5 MHz P5 such that it brings about an increase in the output frequency of 5 MHz P5 which is equivalent to the previous drop. The power of oscillator 10 at 5 MHz P5 must therefore be increased by $2.3 \, 10^{-7}/5 \, 10^{-6} = 0.046$ mW. Globally, in order to obtain a $\Delta f/f = 0$ on the metrological mode 5 MHz P5 we must distribute the internal power as follows:

1/1.46=68.59% on oscillator 20 at 3 MHz P3 and
0.46/1.46=31.5% on oscillator 10 at 5 MHz P5.

It has been shown (see: "Internal Heating and Thermal Regulation of Bulk Quartz Resonators" AFCS 1980) that for a resonator which is very well insulated thermally, the temperature increase per milliwatt in applied internal power was about 2.5° C./mW (also, the increase in applied internal power that is needed per temperature degree is: 0.4 mW/°C.). For a temperature interval between the P.I. temperature and the outer temperature of 100° C. we therefore need 40 mW of internal power applied to the quartz crystal. The isochronism deficiency in a A.T. section is too significant for such power to be applied, therefore it is necessary to operate with a conventional thermostat centered at 50° C. In order to reach a reversal point at 85° C. we need $(85-50) \times 0.4 = 14$ mW which we can distribute 70% on the 3 MHz P3 oscillator 20 and 30% on the 5 MHz P5 oscillator 10. The laws of direct AF and indirect AF effects are linear, so this distribution is the same regardless of the operating point of the resonator. The power distribution is established by adjustment of resistor 47 in the oscillator as compensated.

We should note that a BT section crystal can be used under conditions which are similar to those of a AT section crystal in order to provide an oscillator with a compensated isochronism deficiency.

With respect to the AT section, as with the BT section, the described operation is possible within a wide temperature range, which is typically $-40°$ C. to 85° C. In this temperature range, for those two sections, acquired frequency stability can reach some $10^{-7}$ in relative value, the resonator being heated through internal power and with a conventional thermostat which operates at around 50° C.

Another possibility for compensation of the indirect AF effect with the direct AF effect is conceivable with SC section crystals. Indeed, in some instances, the SC section (double rotation) is preferred to other traditional sections and especially to the AT section for the following reasons:

it is less sensitive to acceleration;
it displays less dynamic temperature effect, thus enabling a quicker temperature setting during the start-up of the oscillator;
it displays a weaker A.F. effect;
it does not display coupled modes; and
thermal compensation around the P.I., is better than with an AT section crystal.

Furthermore, with respect to an SC section, there is a mode (known as mode B) which is very sensitive to temperature and that therefore can be used as a temperature pick-up for the resonating part, in the manner described in FIG. 2.

As in the case with the A.T. section the use of internal heating remains limited for a SC section. Indeed, the isochronism deficiency of that section remains significant, although about 7 times weaker than an AT section. However, through internal heating, and therefore without a thermostat with significant energy savings, frequency balances equal to about $10^{-6}$ in relative value in the range $-40°$ C. to $+80°$ C. can be achieved. The self-thermostated H.F. oscillators with a SC section therefore take up the same applications as the non-thermostated oscillators which are compensated by thermistors with the advantage of not using a variable capacity diode which can lead to short term deterioration of the frequency balance and which also require a very accurate constant voltage reference.

Performances for a HF oscillator which uses a SC section crystal can therefore be of a very high level if an assembly according to the invention is adopted such as the one in FIG. 2.

For instance, we can select as a metrological frequency the third overtone 5 MHz P3 (mode C) of the SC section and as an internal heating vibration frequency the third overtone 5.47 MHz P3 (mode B), or the fifth overtone 9.11 MHz P5 (mode B). The fundamental mode C frequency which is selected here is equal to 1.66 MHz. Experience demonstrates that the direct AF effect (pertaining to the 5 MHz P3) and indirect AF effect (pertaining to the action of 5.47 MHz P3—mode B—on 5 MHz P3) are both linear and in the same direction. Therefore, compensation requires the presence of a reversing circuit 48.

An operating example is as follows: for a SC section crystal which must be maintained at its P.I. which is located at 80° C., we apply a power of 39 mW on mode B (oscillation loop 20) and 1 mW on mode C (oscillation loop 10) the sum, 40 mW, corresponds to the possibility, in internal heating and without a thermostat, of establishing a temperature difference of 100° C. between the quartz crystal and the ambient temperature. Therefore, the ambient temperature is viewed as equal to −20° C. If the ambient temperature increases, we must reduce the internal heating power wihout bringing about a notable frequency change. With respect to a 1 mW cut in the power of oscillator 20 (mode B) (which brings about $\Delta f/f = 2 \cdot 10^{-7}$) we compensate with an increase of about 2/7 mW in the power of oscillator 10 (mode C): indeed, the slope of the AF effect of 5 MHz P3 is $+2 \cdot 10^{-7}$/mW. If we apply on mode B a power which is more or less nil (therefore a drop of 39 mW) we must apply on mode C a power which is equal to 1 mW+2/7×39=12.1 mW. This internal power corresponds to a temperature difference between the quartz crystal and the ambient equal to 2.5×12.1 or 30° C. Since the quartz is maintained at its PI (80° C.) the ambient temperature is therefore 50° C. The temperature range for which the system operates is therefore: −20° C. to +50° C., without a thermostat, and with optimal internal power of 40 mW. Under those circumstances, the quartz crystal remains at its P.I. at 80° C. With only internal heating for the oscillator loop 20, without a thermostat and without compensation for the direct AF effect with the indirect AF effect, frequency stability for a insulated SC section resonator is $10^{-6}$ on the considered range: −20° C. to +50° C. Under the same circumstances with compensation resulting from the presence of elements 46, 47, 48, frequency stability is improved by about a factor of 20 and it therefore becomes $1 \cdot 10^{-7}$.

Finally, in this type of operation, since the B modes are very sensitive to temperature (about −170 Hz/1° C.), one of them (for instance third overtone 5.47 MHz P3) can be used as a temperature pick-up of the resonator (oscillation loop 30) while another (fifth overtone 9.11 MHz P5) is used for heating.

In that case, the power of the oscillation loop 30 remains insignificant in relation to that of oscillation loop 20 and it does not generate any substantial indirect AF effect on the metrological frequency of oscillation loop 10. The power of oscillation loop 30 can be of about several dozen microwatts for instance when the power of oscillation loop 20 equals about several milliwatts.

Figure 3:
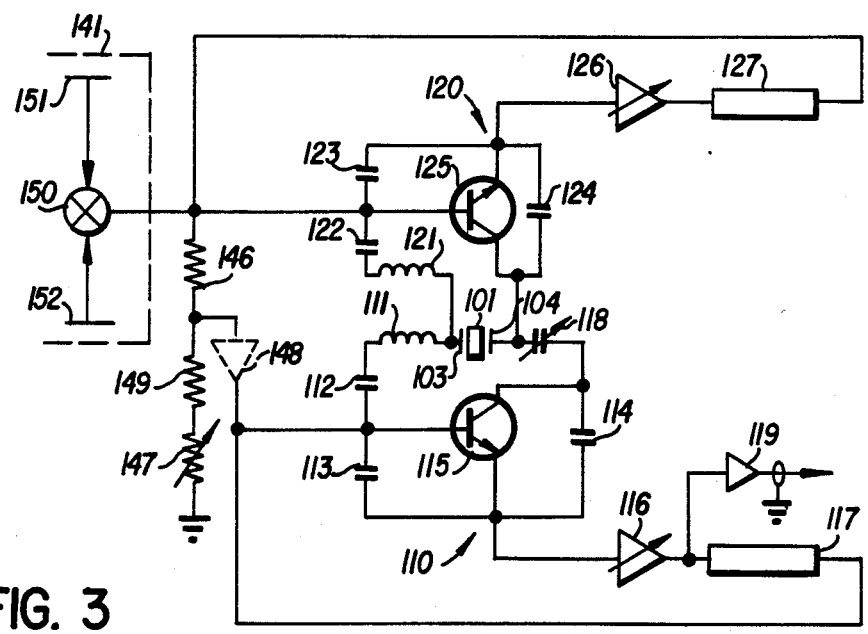
FIG. 3 depicts the electric diagram of a HF oscillator that is supplied by a stabilized source and which includes a compensation loop for influencing variations in the voltage of the stabilized source.

The circuit in FIG. 3 displays a quartz oscillator with a compensated isochronism deficiency which includes two oscillation loops 110 and 120 which cooperate with a resonator comprised of a quartz crystal 101 that is associated to two electrodes 103, 104.

Elements 111 through 119 of oscillation loop 110 and elements 121 through 127 of oscillation loop 120 correspond, respectively, to elements 11 through 19 of oscillation loop 10, and to elements 21 through 29 of oscillation loop 20 for circuits in FIGS. 1 and 2, and therefore they will not be described in detail. However, in the case of the circuit in FIG. 3, no regulation is planned for the temperature of crystal 101 at the level of the resonator 101, 103, 104. The resonator, which is not self-thermostated, is simply placed conventionally in an outer thermostat which has its own regulation and that is not depicted in FIG. 3. Both oscillation loops 110, 120 which allow the crystal 101 to vibrate on a first frequency reference mode (loop 110) and on a second compensation mode (loop 120) therefore play no temperature regulation function and they aid in reducing the isochronism deficiency, or the AF effect, stemming from changes in the supply voltage of the oscillator.

As was stated previously, the isochronism deficiency or AF effect (amplitude-frequency) corresponds to a frequency change in the oscillator which is related to a change in the amplitude of oscillations, itself related to a change in the excitation power of the resonator. This change in excitation power can especially come from fluctuations or shifts in the supply source of the oscillator. Indeed, even in the presence of a regulation of supply voltage, HF quartz and high stability oscillators remain sensitive to residual fluctuations or shifts in supply voltage.

The isochronism deficiency can be reduced through the selection of a crystal which is cut in a particular way according to the crystallographic marker, but the low isochronism deficiency sections usually display other disadvantages, such as thermal properties of little interest.

Thus, it is usually desirable to use for a high stability HF oscillator a quartz crystal with an AT section of which the isochronism deficiency at a fifth overtone 5 MHz P5 vibration remains such that the relative frequency variation $\Delta f/f$ in relation to the excitation power is close to $5 \cdot 10^{-6}$/mW.

The compensation for that isochronism deficiency can be achieved automatically and permanently with the circuit in FIG. 3 where the resonator 101, 103, 104 operates simultaneously on two frequencies. The initial frequency corresponds to the normal operating mode of the resonator and it represents the metrological mode which delivers a very stable reference frequency and its produced by oscillation loop 110. With a 5 MHz oscillator that uses a AT section, this mode can be the fifth overtone for a thickness shearing vibration.

The second frequency which is produced by the excitation loop 120 corresponds for instance in the case of the AT section to the third overtone, therefore to a frequency which is more or less equal to 3 MHz.

The electronic circuits in the oscillator loops 110, 120 are supplied from the same voltage regulator 141, so that the voltage fluctuations of the regulator induce power variations which are proportionate on both oscillator loops 110, 120. This can be obtained by a single bridge of resistors which is placed between the voltage regulator 141 and the oscillator loops 110, 120. In the event of a AT section crystal, the direct AF effect of the fifth overtone 5 MHz P5 mode is linear according to the applied power, and the slopes of the curves which depict the relative frequency variations according to the applied power of opposite sign are respectively about 5.10$^{-6}$/mW and −2.5 10$^{-6}$/mW so that compensation for the isochronism deficiency takes place automatically if any change in the voltage of the feed regulator 141 of both oscillation loops 110, 120 is applied respectively in the ratio of 1 to 2 on the metrological circuit 110 and on the compensation circuit 120.

As we can see in FIG. 3, the voltage regulator 141 can include two feed sources 151, 152 which are tied to the oscillation loops 110 and 120 of which the voltages are compared constantly with a comparator 150 which is initially adjusted at zero. In the event of a change in one or the other supply voltage for sources 151 and 152, an error voltage appears at the comparator 150 output. This error voltage on the one hand is placed directly on the base of transistor 125 of the compensation circuit 120 and on the other hand by way of the divider bridge 146, 149, 147 on the base of transistor 115 of the metrological circuit 110. The error voltage at the comparator 150 output is placed therefore onto the bases of transistor circuits of oscillator loops 110, 120 according to a ratio that is independent of the oscillating level for each oscillator and adjusted in advance by the selection of values for resistors 146, 149 and of the linear end adjustment potentiometer 147, according to the features of direct AF and indirect AF effects which are tied to the vibration modes that were selected for the crystal 101, so that the frequency change of the metrological mode remains nil.

In the event that the direct AF and indirect AF effects which pertain to the two vibration modes which were selected for the crystal 101 are translated into relative variation frequency curves with slopes that share the same sign, as is the case for instance with vibrations on mode C and mode B for a SC section, all that is needed is a change in the circuit of FIG. 3 by adding a reversing circuit 148 (represented in broken lines) between the mid point of the divider bridge 146, 149, 147 and the poling line of the oscillation loop 110.

We will note that the execution of a compensated isochronism oscillator such as the one which is depicted in FIG. 3 can operate at fairly high power levels, which leads to a high signal/noise ratio, and therefore to great spectral purity. The operating power of the metrological mode for instance can be selected to correspond to zero aging (or 80 μW for one natural crystal, AT section, fifth overtone 5 MHz P5).

I claim:

1. A high frequency oscillator of the kind that includes, mounted in a sealed structure, a piezo-electric resonator comprised of at least one piezo-electric crystal (1) that is connected to at least two exciter electrodes (3, 4) said electrodes producing an electric field in the active part of the piezo-electric crystal (1), means for applying to the electrodes (3, 4) on the one hand electric power for exciting the crystal according to a useful vibratory mode that is selected for determining a frequency reference and on the other hand a main electric internal heating power to excite the crystal according to a second vibratory mode consisting of an overtone vibration which is different from the vibration of the useful vibratory mode, the main electric internal heating power being regulated with a temperature pick-up (2, 7), located on the resonator or in its vicinity, in order to constantly maintain the temperature of the resonator at the reversing point of the crystal, including: means (46, 47) for regulating the electric power for exciting the crystal according to the useful vibratory mode in a predetermined and constant proportion in relation to the main electric heating power so as to provide a compensation for an indirect amplitude-frequency effect which is produced on the frequency of the useful vibratory mode by the vibration that is designed to produce main internal heating.

2. An oscillator according to claim 1, wherein said oscillator is placed inside a conventional thermostat that operates at a temperature of approximately 50° C.

3. An oscillator according to claim 2, wherein the piezo-electric crystal (1) is of an AT section, and is proportioned and excited to display a useful vibration frequency on a fifth overtone as well as a main internal heating vibration frequency at a frequency which is distinct from the useful frequency, on a third overtone, and wherein the total internal electric power which is applied to the electrodes (3, 4) of the resonator, that is regulated according to signals supplied by said temperature pick-up (2, 7), is distributed at a ratio of approximately 70% on the third overtone and of approximately 30% on the fifth overtone, the power distribution being produced by an adjustment of oscillator regulating means (46, 47).

4. An oscillator according to claim 2 wherein the piezo-electric crystal (1) has a SC section, and is proportioned and excited to display a useful vibration frequency on a third overtone of a first vibratory mode as well as an internal heating vibration frequency on a third overtone of a second vibratory mode and wherein, for a given variation $\Delta P_B$ of the internal electric power that is applied to the electrodes of the resonator on said second vibratory mode, means (46, 47, 48) are provided to vary inversely, the electric power which is applied to said first vibratory mode at approximately 28.5% of the variaton $\Delta P_B$ of the internal electric power that is applied to said second vibratory mode.

5. An oscillator according to claim 4, wherein the temperature pick-up (7) includes two electrodes (5, 6) which cooperatre with the piezo-electric crystal (1) in order to generate a vibration of the crystal on said second vibratory mode, which is distinct from the vibration that is used for main internal heating, said different vibration on said second vibratory mode representing a thermometric mode.

6. An oscillator according to claim 5, wherein the electric excitation power on the first and second modes are applied with two distinct oscillating loops (10, 20) and wherein the electric excitation power on the thermometric mode is applied to the resonator with a third oscillating loop (30) that is connected to a pair of electrodes (5, 6) which are distinct from the pair of electrodes (3, 4) that are connected to the first two oscillating loops (10, 20), said electric excitation power on the thermometric mode remaining insignificant in relation to the second mode power.

7. A high frequency oscillator which includes, mounted in a sealed structure, a piezo-electric resonator which is comprised of at least one piezo-electric crystal (101) that is connected to at least two excited electrodes (103, 104), said electrodes generating an electric field in the active part of the crystal (101) from a regulated supply source (141) of which the voltage can vary in time, the supply source (141) supplying an electric excitation power for the crystal according to a useful vibratory mode which is selected to determine a frequency reference, said high frequency oscillator including means (146, 147, 149) for applying to the resonator (101, 103, 104) a pre-set fraction of the electric excitation power which is applied to the electrodes in connection with a vibration on said useful vibratory mode, in order to produce a vibration on another predetermined vibratory mode of the resonator so as to provide, with an indirect amplitude-frequency effect on the useful vibratory mode, a compensation for changes in the frequency of the useful vibratory mode stemming from changes in the electric excitation power applied to the electrodes.

8. An oscillator according to claim 7, wherein electric excitation power on the useful vibratory mode, and electric exictation power for compensation with the indirect amplitude-frequency effect, are applied with two distinct oscillating loops (110, 120) supplied from a same voltage regulator (141).

9. An oscillator according to claim 8, wherein the distribution of electric power that is applied to the two oscillating loops (110, 120) is executed with a bridge of resistors (146, 149) connected to a linear potentiometer (147) and inserted between the voltage regulator (141) and the oscillating loops (110, 120).

10. An oscillator according to claim 9, wherein the voltage regulator (141) includes two supply sources (151, 152) and a comparator (150).

11. An oscillator according to claim 10, wherein the piezo-electric crystal (101) is a AT section, and is proportioned and excited to display a useful vibration frequency on a fifth overtone as well as a compensation vibration frequency on a third overtone and wherein the total internal electric power which is applied to the electrodes (103, 104) on the resonator is distributed by the fractioning means (146, 147) with a ratio of approximately 30% on the fifth overtone and of approximately 70% on the third overtone.

12. An oscillator according to claim 10, wherein the piezo-electric crystal (101) is a SC section, and is proportioned and excited to display a useful vibration frequency on the third overtone of a first vibratory mode as well as a compensation vibration frequency on the third overtone of a second vibratory mode and wherein means (146, 147, 149, 148) are provided to have electric power which is applied to said first and second vibratory modes vary inversely and simultaneously, the power applied to said second vibratory mode changing in a ratio of about 3.5 times the variation $\Delta P_C$ of the internal electric power applied to said first vibratory mode.

* * * * *